United States Patent
Suzuki et al.

(10) Patent No.: US 6,967,334 B2
(45) Date of Patent: Nov. 22, 2005

(54) ION SOURCE AND ION BEAM DEVICE

(75) Inventors: Masayasu Suzuki, Hadano (JP);
Masahiro Ueda, Atsugi (JP); Yoshiyuki Konishi, Hadano (JP)

(73) Assignee: Shimadzu Corporation, Kyoto (JP)

( * ) Notice: Subject to any disclaimer, the term of this patent is extended or adjusted under 35 U.S.C. 154(b) by 73 days.

(21) Appl. No.: 10/788,371

(22) Filed: Mar. 1, 2004

(65) Prior Publication Data

US 2004/0173758 A1 Sep. 9, 2004

(30) Foreign Application Priority Data

Mar. 4, 2003 (JP) ............................. 2003-056703
May 9, 2003 (JP) ............................. 2003-131896

(51) Int. Cl.[7] .......................... H01J 27/00; H01J 49/10
(52) U.S. Cl. .............................. 250/423 R; 250/492.3; 250/492.2
(58) Field of Search .................... 250/492.2, 423 R, 250/492.3

(56) References Cited

U.S. PATENT DOCUMENTS 4,926,056 A * 5/1990 Spindt .................... 250/423 F
6,238,582 B1 * 5/2001 Williams et al. ............... 216/22

* cited by examiner

Primary Examiner—Nikita Wells
Assistant Examiner—James J. Leybourne
(74) Attorney, Agent, or Firm—Manabu Kanesaka

(57) ABSTRACT

An ion source includes a plasma producing device, an ion extraction electrode having a first grid with a positive potential and a second grid with negative potential for extracting ions from a plasma excitation area of the plasma source device, and a communicating portion communicating the plasma excitation area with an outside thereof for removing an influence of the negative potential of the second grid with respect to electrons from the plasma excitation area.

10 Claims, 9 Drawing Sheets

ION SOURCE AND ION BEAM DEVICE

BACKGROUND OF THE INVENTION AND RELATED ART STATEMENT

The present invention relates to an ion source to be used for ion beam etching, ion beam sputtering and the like, and to an ion beam device provided with the ion source.

In an ion beam device, ions are derived from plasma generated in the ion source and the derived ions are used for various processes. For example, in an ion beam etching device, the derived ions are irradiated on a base plate for etching. In an ion beam sputtering device, a target is subjected to sputtering by the derived ions.

Incidentally, when the base plate or target is made of an insulation material or covered with an insulation material, positive charge of the irradiated ions is accumulated on the insulation material, so that the base plate or the target is positively charged due to the charge build-up. Therefore, it is difficult to irradiate the ions on the base plate or the target due to an electric field of the accumulated positive charge.

Heretofore, as a method for preventing such a charge build-up, there has been a method wherein a metal heater such as a tungsten filament is disposed in a path of the ion beams between an ion source and an object to be processed (base plate or target). When the heater is heated to a high temperature, the heater generates thermal electrons to neutralize the accumulated positive charge. Also, there has been a method wherein a plasma source is provided separately from an ion source between the ion source and an object to be processed. The plasma source generates electrons to neutralize the positive charge accumulated on the object to be processed, as disclosed in Japanese Patent Publication (Kokai) No. 2003-31175.

In the method using the metal heater, the metal heater is exposed to the ions so that the metal heater is subjected to sputtering, resulting in pollution. In a case of the reactive ion beam etching (RIBE), a reaction between the metal heater and the process gas becomes a problem. In the method using the separate plasma source, the plasma is generated through DC discharge, RF discharge, ECR using a microwave, and the like. In any case, it is necessary to separately provide a device for exciting the plasma, thereby making an adjustment thereof difficult and increasing a cost of the device.

In view of the above problems, the present invention has been made, and an object of the invention is to provide an ion source in which it is possible to prevent the charge build-up of a target by using electrons in plasma, and an ion beam device provided with the ion source.

Further objects and advantages of the invention will be apparent from the following description of the invention.

SUMMARY OF THE INVENTION

According to a first aspect of the invention, an ion source includes: a plasma producing device; an ion deriving electrode having a first grid with a positive potential and a second grid with a negative potential for deriving ions from a plasma producing area of the plasma producing device; and a communicating portion communicating the plasma producing area with an outside thereof for removing an influence of the negative potential of the second grid with respect to electrons of the plasma producing area.

According to a second aspect of the invention, in the ion source of the first aspect, the communicating portion is disposed in the ion deriving electrode to have a potential same as that of the first grid. The communicating portion is an electro-conductive tubular member communicating the plasma producing area with an outside thereof.

According to a third aspect of the invention, the ion source may further include a third grid with an earth potential in addition to the first and second grids. The communicating portion is disposed in the ion deriving electrode to have a potential same as that of the third grid, and is an electro-conductive tubular member communicating the plasma producing area with an outside thereof.

According to a fourth aspect of the invention, an ion beam device includes the ion source of the first aspect for irradiating ion beams on a target.

According to a fifth aspect of the invention, in the ion beam device of the fourth embodiment, the target is electrically insulated from a cold end of a power source providing the positive potential to the first grid.

According to a sixth aspect of the invention, the ion beam device may further include an electric resistor connecting the target and the cold end of the power source.

DETAILED DESCRIPTION OF PREFERRED EMBODIMENTS

Figure 1:
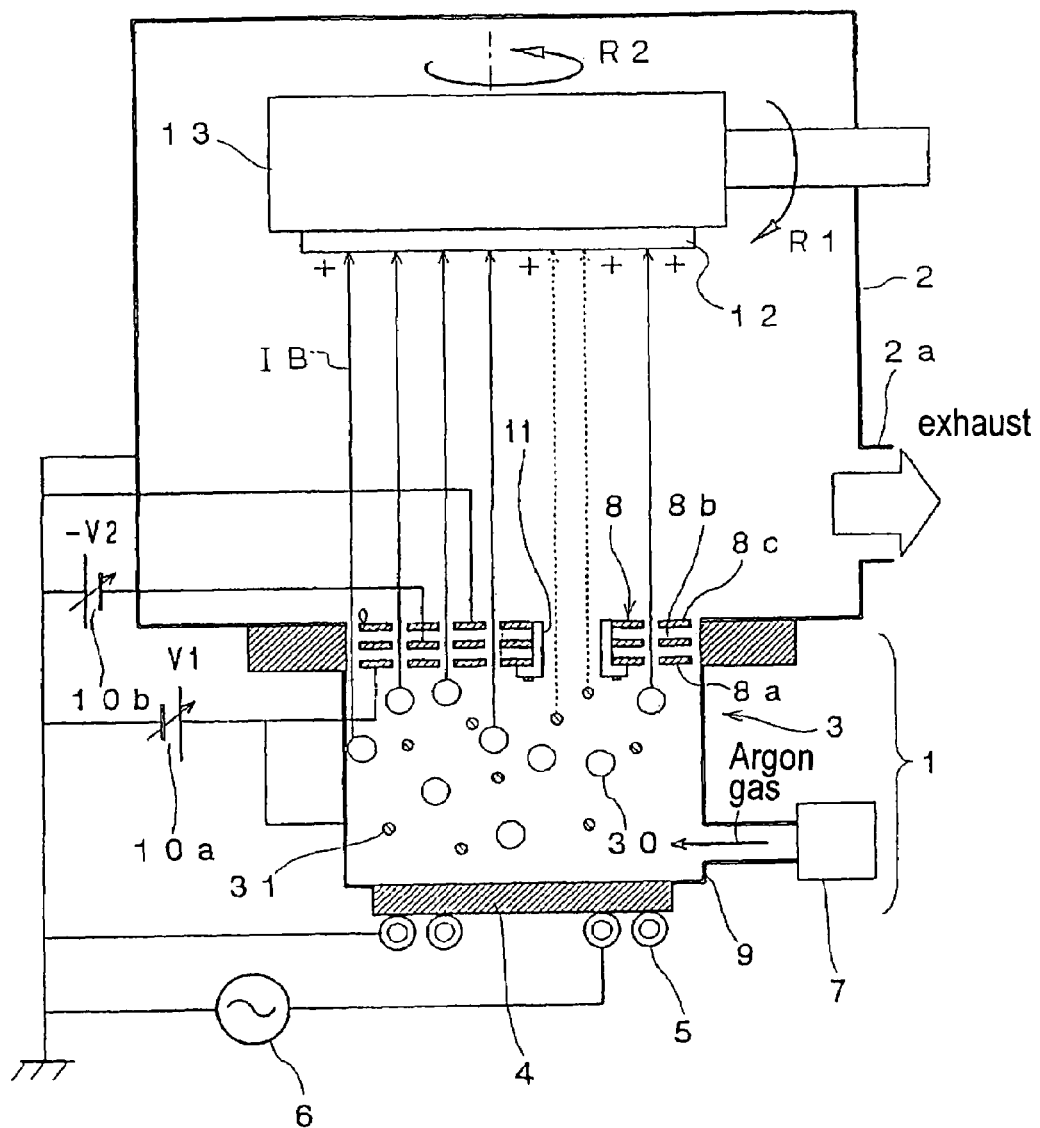
FIG. 1 is a block diagram showing an ion beam device according to a first embodiment of the invention.

Hereunder, embodiments of the present invention will be explained with respect to the accompanying drawings. FIG. 1 shows an ion beam device according to a first embodiment of the invention. FIG. 1 is a schematic view of an ion beam etching device, wherein an ion source 1 and a process chamber 2 for performing an etching process are provided. In the ion beam device shown in FIG. 1, the ion source 1 is formed of a plasma source 3 as a plasma producing device and an ion deriving electrode 8 provided to the plasma source 3.

The plasma source 3 of the present embodiment is a high frequency induction coupling plasma source that produces plasma through high frequency induction coupling. A plasma chamber 9 of the plasma source 3 is provided with a high frequency introduction window 4. Flat type excitation coils 5 are provided at an outside of the high frequency introduction window 4 for generating the high frequency. An RF power source 6 is connected to the excitation coil 5 for supplying a high frequency current of 13.56 MHz. The high frequency introduction window 4 is made of a dielectric material such as quartz and ceramic. Incidentally, a matching circuit (not shown) is provided between the excitation coil 5 and the RF power source 6 for matching impedance.

A gas supply source 7 introduces a gas into the plasma chamber 9 for producing plasma. In the present embodiment, an argon gas is used as the plasma producing gas. Grids 8a, 8b and 8c constituting the ion deriving electrode 8 are provided at an opening portion of the plasma chamber 9. A positive potential V1 is applied to the grid 8a from a grid power source 10a; a negative potential (−V2) is applied to the grid 8b from a grid power source 10b; and an earth potential Vg is applied to the grid 8c. Incidentally, the plasma chamber 9 has the same potential (V1) as that of the grid 8a.

In the present embodiment, an electron port 11 made of a conductive material is provided to the ion deriving electrode 8. In the ion deriving electrode 8 shown in FIG. 1, the electron port 11 is provided to the grid 8a and has the same potential (V1) as that of the grid 8a. The electron port 11 will be described in detail later.

A base plate holder 13 is disposed in the process chamber 2 for holding a base plate 12 as an etching target. The base plate holder 13 rotates and is inclined as shown by an arrow R1 so that an angle of the base plate 12 with respect to the ion beam IB can be set at various angles. A mechanism may be provided to the base holder 13 for rotating the base plate 12 as shown by an arrow R2. An exhaust port 2a is provided to the process chamber 2, and a vacuum pump (not shown) is connected to the exhaust port 2a for evacuating the process chamber 2.

Figure 2:
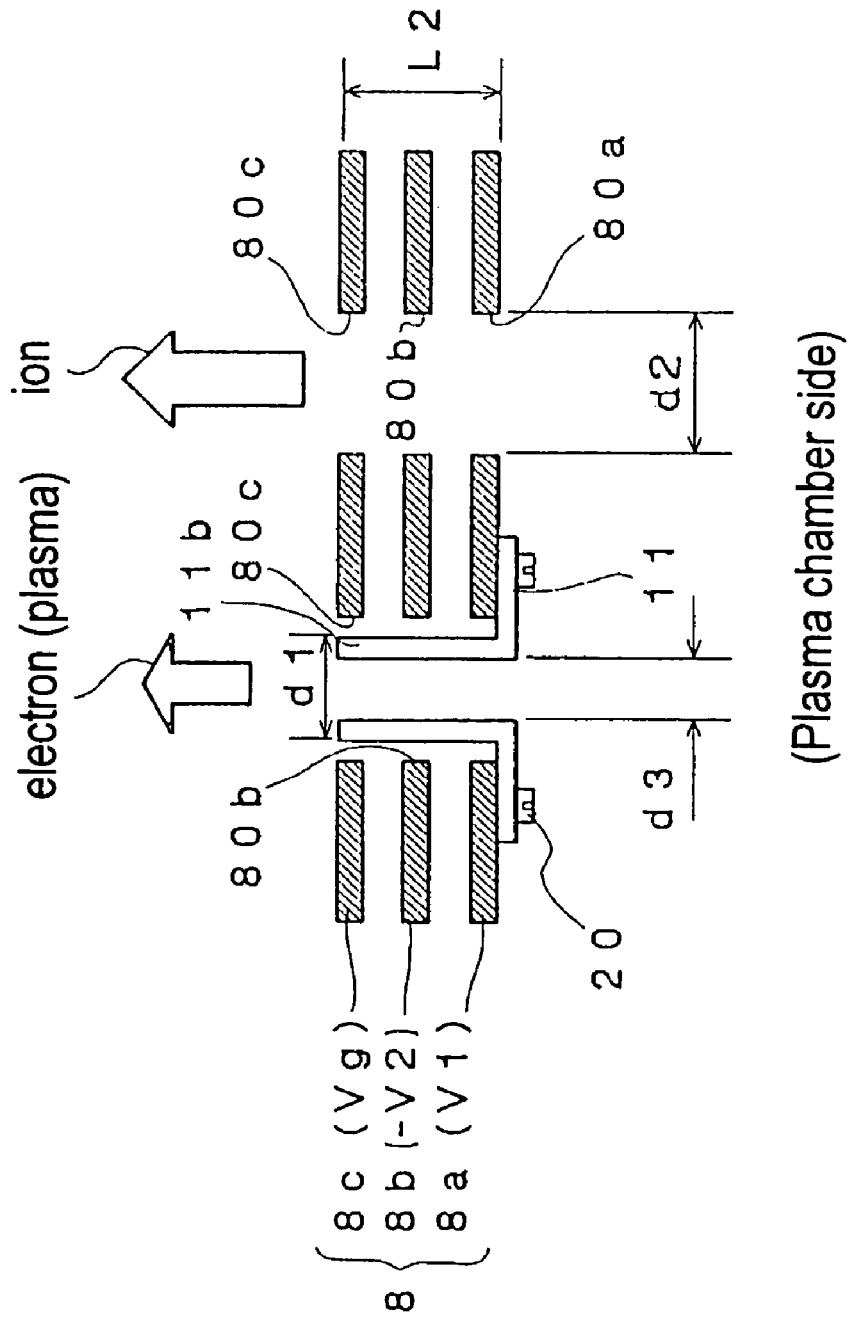
FIG. 2 is a sectional view showing a partial ion deriving electrode.

FIG. 2 is a sectional view showing a part of the ion deriving electrode 8. The respective grids 8a to 8c are formed of conductive plates having holes 80a, 80b and 80c. The holes 80a of the grid 8a, the holes 80b of the grid 8b and the holes 80c of the grid 8c are arranged concentrically so that the process chamber 2 side can be seen from the plasma chamber 9 side through the holes 80a to 80c. The electron port 11 is provided at the holes 80a to 80c of the grids 8a to 8c. In this case, the number of the electron ports 11 may be a single or plural.

Figure 3:
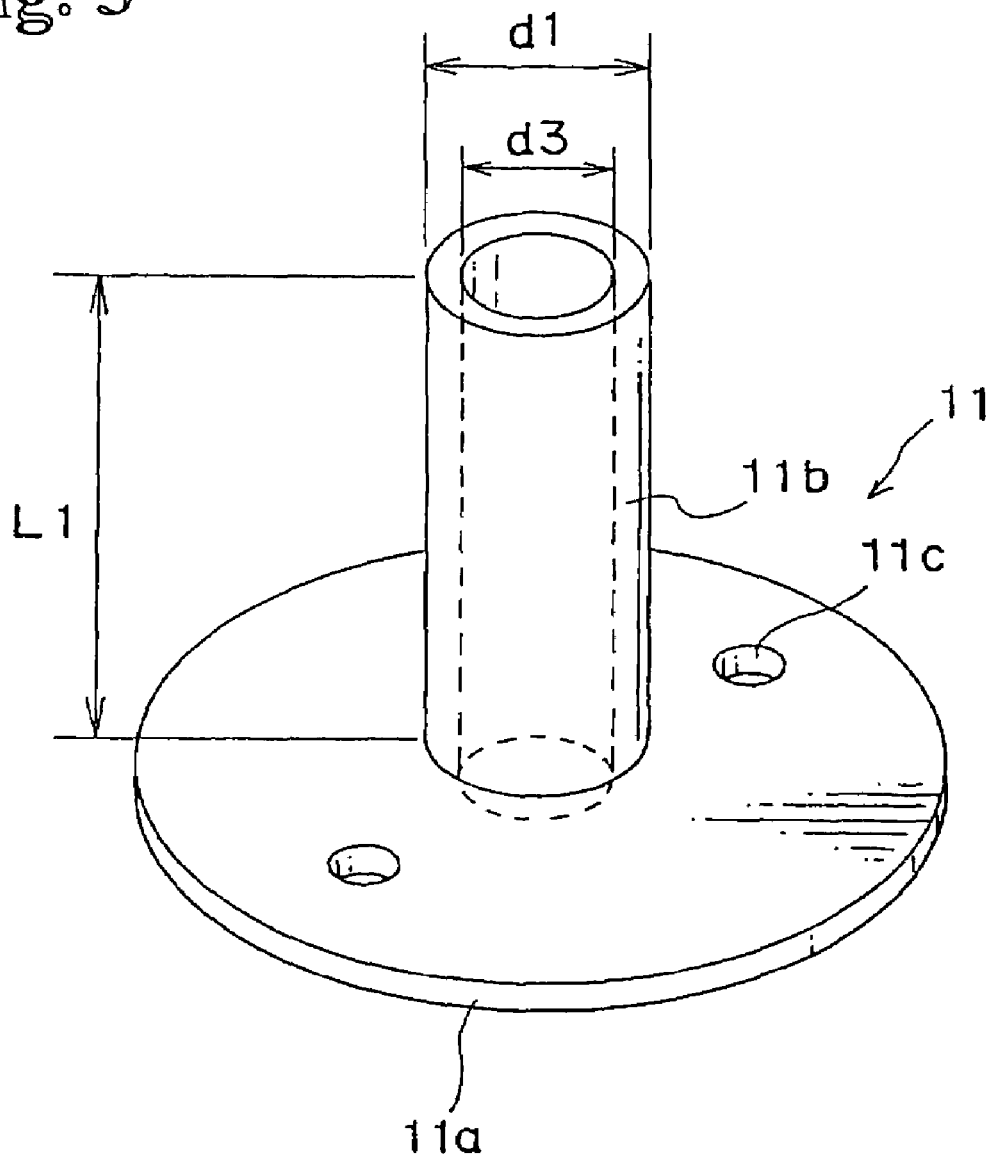
FIG. 3 is a perspective view of an electron port.

FIG. 3 is a perspective view of the electron port 11. The electron port 11 is made of a conductive material as described above, and includes a flange portion 11a and a tubular portion 11b projected from the flange portion 11a. Screwing holes 11c are formed in the flange portion 11a. In the ion deriving electrode 8 shown in FIG. 2, the electron port 11 is fixed to the grid 8a, and the tubular portion 11b is inserted into the respective holes 80a to 80c.

As shown in FIG. 2, screws 20 fix the electron port 11 to the grid 8a. The tubular portion 11b of the electron port 11 has an outer diameter d1 smaller than a diameter d2 of the holes 80a to 80c. Accordingly, when the tubular portion 11b is attached, the tubular portion 11b does not contact the respective grids 8a to 8c. It is preferable that a length L1 of the tubular portion 11b (refer to FIG. 3) is set to be larger than a thickness L2 of the ion deriving electrode 8. An inner diameter d3 of the tubular portion 11b is set to be about 2 to 10 mm. Incidentally, an arbitrary number of the electron ports with an arbitrary inner diameter may be provided at arbitrary positions according to conditions of the device.

As shown in FIG. 1, the argon gas is introduced into the plasma chamber 9, and the high frequency generated by the exciting coil 5 is introduced into the plasma chamber 9 through the high frequency introduction window 4. Accordingly, electrons are separated from the argon gas to produce plasma containing argon ions 30 and electrons 31. The argon ions 30 are accelerated by an electric field formed between the positive potential grid 8a and the negative potential grid 8b, and then are decelerated between the grid 8b and the earth potential grid 8c. Finally, ion beams IB with energy corresponding to a potential difference between the grid 8a and the grid 8c are formed.

The accelerated argon ions 30 are irradiated on the base plate 12 for etching a surface thereof. When the base plate 12 is made of a conductive material, the positive electric charge of the argon ions 30 irradiated on the base plate 12 flows from the base plate 12 to the grounded base plate holder 13. When the base plate 12 is made of an insulation material such as $SiO_2$, the positive electric charge accumulates on the surface of the base plate, as shown in FIG. 1, thereby increasing the potential of the base plate. The electric field between the grid 8a and the grid 8b prevents the negatively charged electrons 31 from leaking to the process chamber 2 through the holes 80a to 80c.

In the electron port 11, as shown in FIG. 2, the tubular portion 11b has the same potential as that of the grid 8a, and extends to the grid 8c. Therefore, the effect of the grid 8b does not reach an inside of the tubular portion 11b, and the inner space of the tubular portion 11b has substantially a uniform potential. As a result, there is no electric field that prevents the plasma containing the electrons 31 from moving, and the plasma can move to the process chamber 2. The electrons 31 have mobility larger than that of the argon ions 30. Accordingly, the electrons 31 easily move toward the positive electric charge when the base plate 12 is positively charged, so that the electrons 31 in the plasma chamber 9 are derived through the electron port 11 toward the base plate 12 and are irradiated on the base plate 12.

When the positive charge on the base plate 12 is reduced, the quantity of the electrons 31 irradiated on the base plate 12 is reduced. Accordingly, the electrons 31 are irradiated on the base plate 12 from the plasma chamber 9 through the electron port 11 according to the quantity of the positive charge accumulated on the base plate 12, thereby neutralizing the positive charge on the base plate 12.

Figure 4:
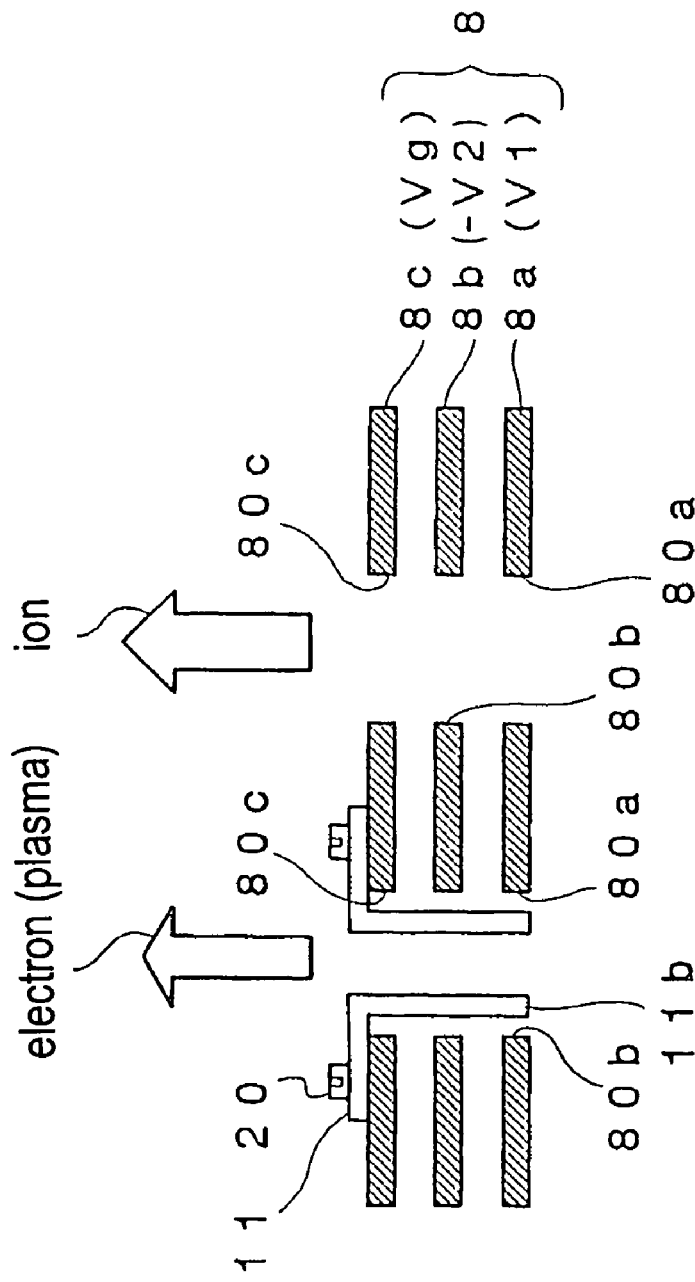
FIG. 4 is a schematic view showing a case where the electron port is provided to a grid.

Incidentally, in the device shown in FIG. 2, the electron port 11 is provided to the grid 8a with the positive potential V1. Alternatively, the electron port 11 may be provided to the grid 8c with the earth potential Vg, as shown in FIG. 4. In this case, the electron port 11 is fixed so that the tubular portion 11b is inserted into the holes 8a to 8c. As a result, the electron port 11 has the earth potential Vg, and the potential of the grid 8b does not affect the electrons 31.

Figure 5:
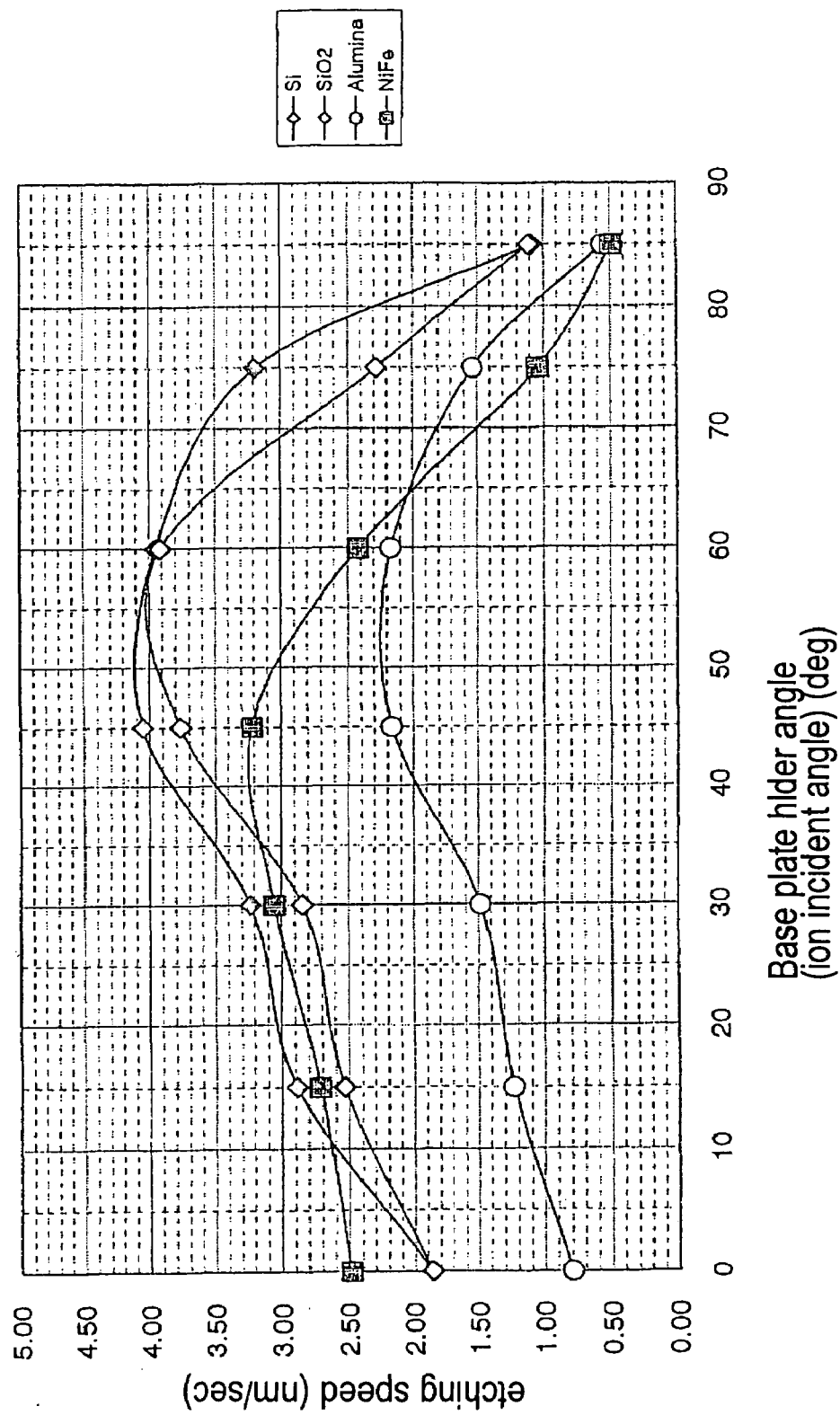
FIG. 5 is a graph showing etching speeds of electro-conductive materials (Si, NiFe) and insulating materials ($SiO_2$, alumina) when the electron port is provided.

FIG. 5 shows etching speeds of conductive materials (Si, NiFe) and insulation materials ($SiO_2$, alumina) using the ion source provided with the electron port 11. In FIG. 5, the vertical axis represents the etching speeds, and the horizontal axis represents incident angles of the ions. Conventionally, when an ion source is not provided with a neutralizer such as a thermal emission heater and a separate plasma source, it is not practically possible to etch an insulation material due to the build-up of the positive charge. When the ion source is provided with the electron port 11, it is possible to achieve a sufficient etching speed for $SiO_2$ and alumina as shown in FIG. 5.

As described above, in the first embodiment, the electron port 11 is provided in the ion deriving electrode 8. Accordingly, it is possible to eliminate the influence of the grid 8b preventing the electrons 31 from moving to the process chamber side. As a result, the electrons 31 in the plasma move toward the positively charged base plate 12 to neutralize the positive charge on the base plate 12, thereby maintaining the etching effect of the argon ions 30.

Also, the electrons 31 are irradiated on the base plate 12 in the quantity corresponding to the charged quantity of the base plate 12. Accordingly, it is possible to remove a variance such as too little or too much electrons, thereby eliminating cumbersome adjustments. Further, the electrons 31 move at a speed faster than that of the argon ions 30. Therefore, when the positive charge is built up on the base plate 12, the electrons 31 quickly neutralize the charge.

In the first embodiment, mere the electron port 11 is provided to the ion deriving electrode 8, thereby reducing a cost as compared with the conventional methods using the thermal emission heater and the separate plasma source.

Figure 6:
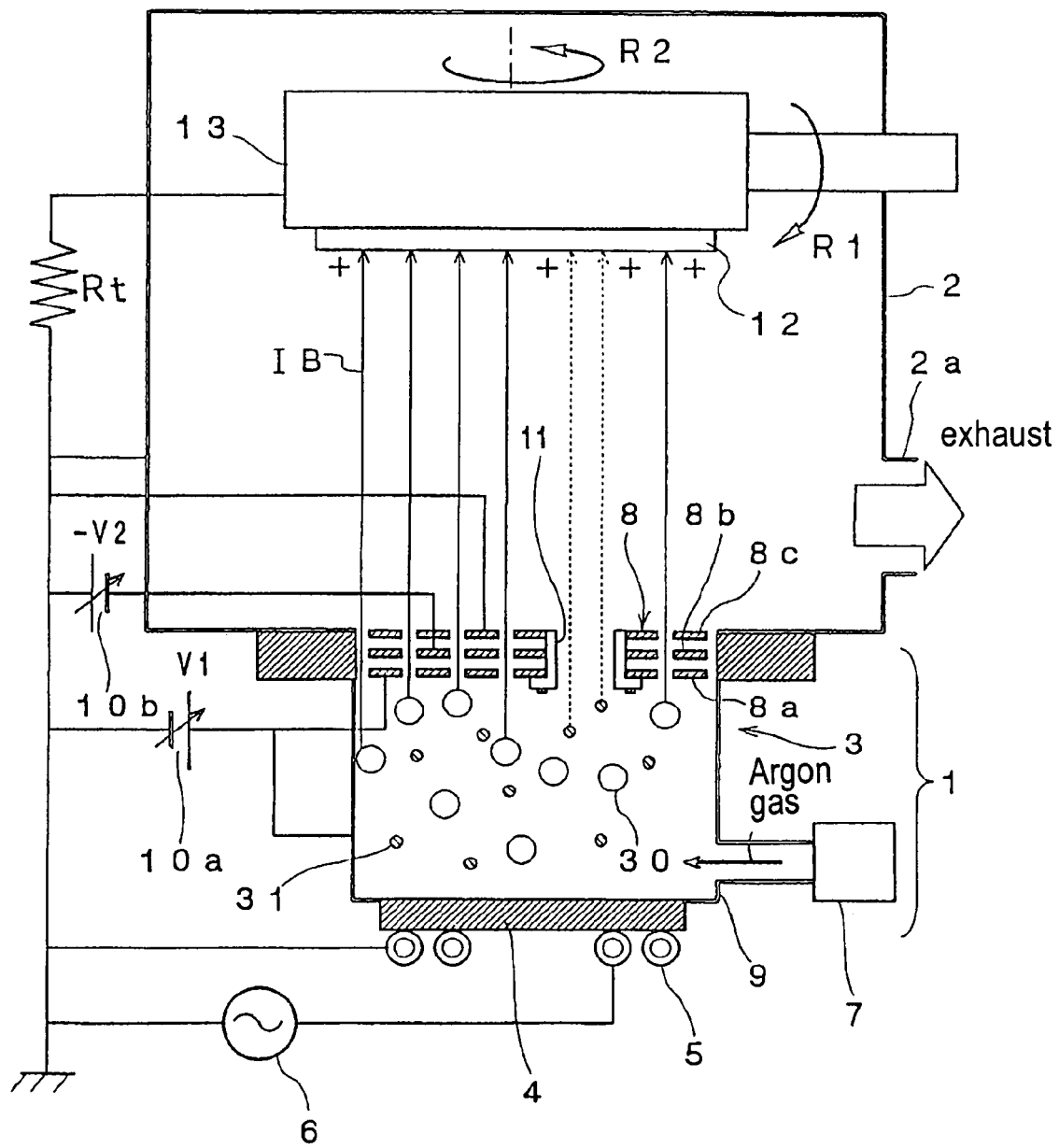
FIG. 6 is a block diagram showing an ion beam device according to a second embodiment of the invention.

FIG. 6 shows an ion beam device according to a second embodiment of the invention. In the device shown in FIG. 6, a terminal resistance Rt is connected to the base plate holder 13 of the device shown in FIG. 1. The base plate holder 13 is connected to the process chamber 2 with the standard potential (earth potential) through the terminal resistance Rt.

As described above, the interior space of the electron port 11 has substantially the uniform potential. Accordingly, a part of the plasmas confined in the plasma source 3 by the grids 8a to 8c leaks out to the process chamber 2 through the electron port 11. At this time, the electrons 31 have the mobility greater than that of the argon ions 30 and the base plate 12 is positively charged. As a result, the electrons 31 neutralize the charge on the base plate 12.

When the electron port 11 has a large inner diameter d3 (refer to FIG. 2), a density of the plasma leaked into the process chamber 2 becomes approximately the same as that of the plasma in the plasma source 3. When the inner diameter d3 is made about 2–10 mm, the plasma density in the process chamber 2 sufficiently becomes smaller than that in the plasma source 3, thereby making the ion beam etching easy.

Figure 7:
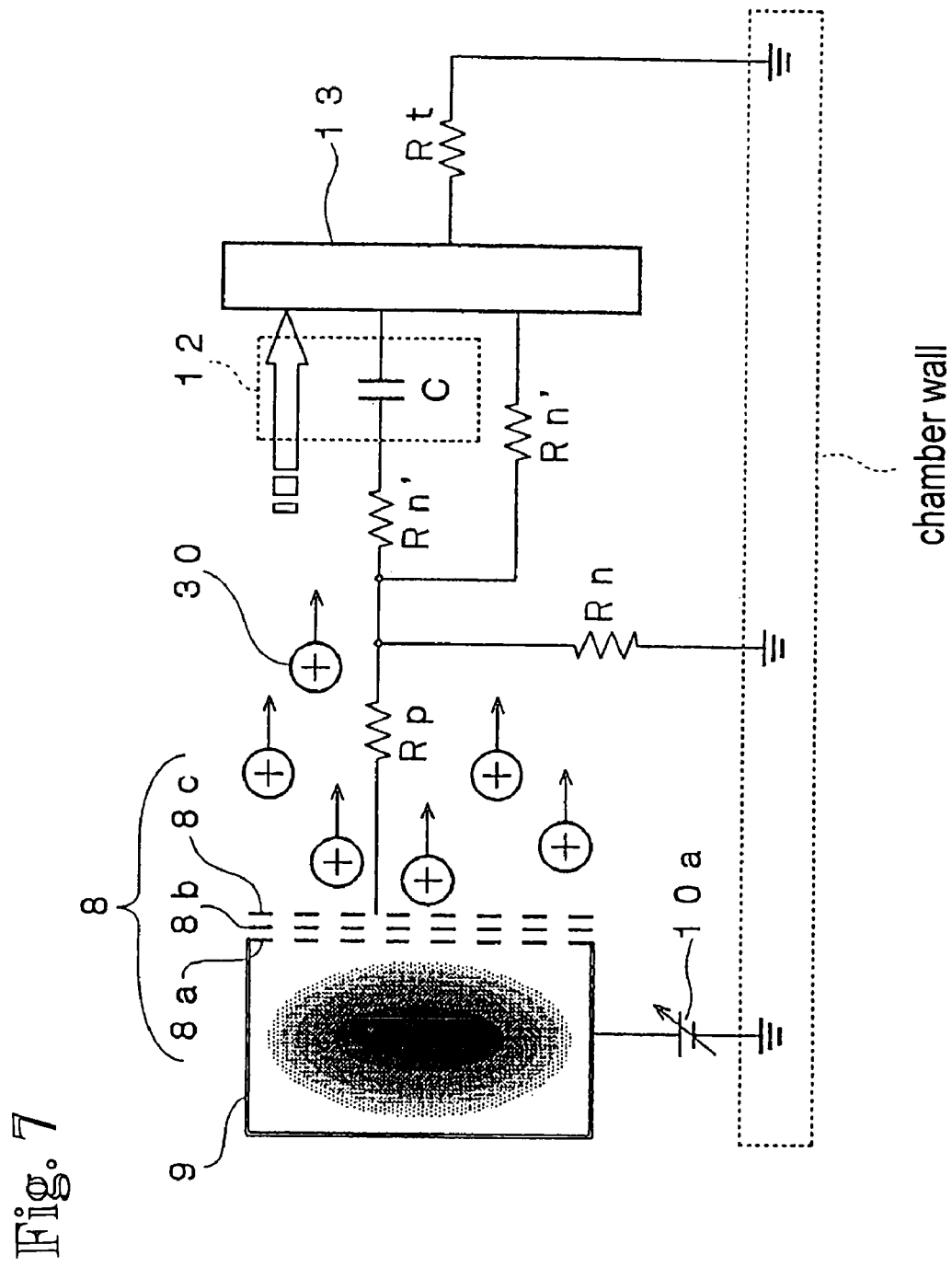
FIG. 7 is a schematic view for explaining a principle of the ion beam device shown in FIG. 6.
Figure 8:
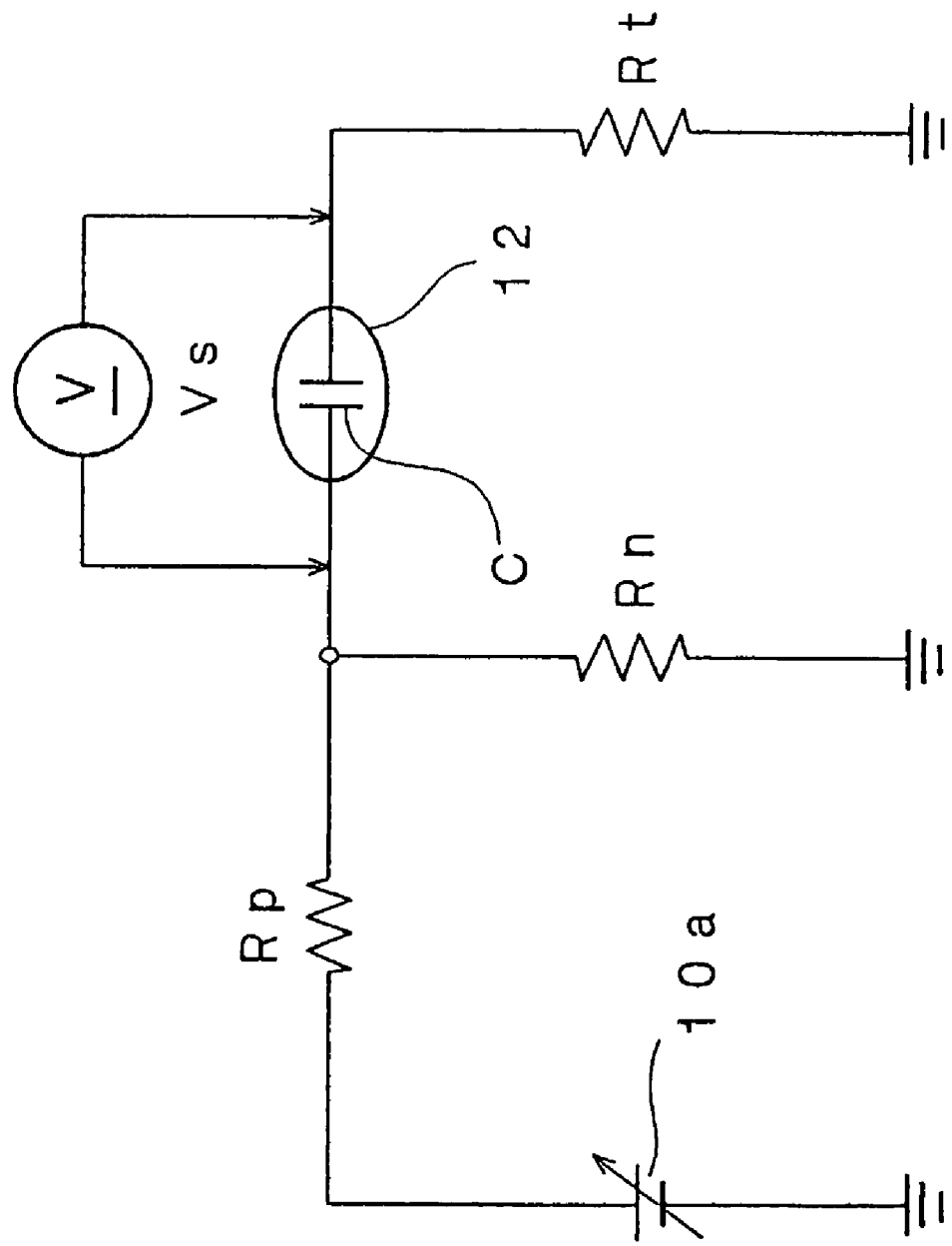
FIG. 8 is a simplified view of the schematic view shown in FIG. 7.

FIG. 7 is a schematic view for explaining a principle of the ion beam device as shown in FIG. 6. FIG. 8 is a simplified diagram of the schematic diagram shown in FIG. 7. Resistance values Rp, Rn and Rn' are proportional to an inverse number of the electrical conductivity of the plasma leaked into the process chamber 2. The resistance value Rp relates to an ion current; the resistance value Rn is a resistivity between the plasma in the process chamber and a chamber wall; and the resistance value Rn' is a resistivity between the plasma and the base plate surface or base plate holder surface.

Since the base plate 12 is made of an insulating material or is covered with a coating film of an insulating material, the base plate surface is insulated from the base plate holder 13, i.e. an equivalent to a capacitor C in an electric circuit. Similar to the first embodiment, the resistance value Rn contributes to the neutralization of the charge. In the first embodiment, the plasma leaked into the process chamber 2 contacts the base plate, and the surface potential is determined accordingly. Also, in the conventional device, the separate plasma exciting source is provided in the process chamber 2 as the neutralizer and the potential of the neutralizer is adjusted, so that the surface potential of the base plate 12 as an ion beam irradiation target can be controlled.

In recent years, electric devices have been minimized drastically. Accordingly, a localized charge in a small scale may cause damage to such electric devices. This is a problem in addition to the problem of lowering the ion etching efficiency due to the charge build-up as described above. In some cases, a withstand voltage is in the order of 5 V. As described above, when the base plate surface potential is controlled through the plasma contact, a potential difference between a front surface and a back surface of the base plate, i.e. a potential difference between a front surface of the base plate and the base plate holder, generates an electric field stress to the device. That is, a voltage stress Vs is present between two ends of the capacitor C (see FIGS. 7 and 8), i.e. between the front surface and back surface of the base plate. When Vs exceeds the withstand voltage, an excessive current 40 flows through the base plate 12, thereby causing damage to the device.

In the second embodiment, the terminal resistance Rt is provided between the base plate holder 13 and the chamber wall, thereby reducing the potential on the front surface of the base plate and preventing the damage. As shown in FIG. 8, the potential of the base plate holder 13 increases with the terminal resistance Rt, and the potential difference between the base plate holder and the base plate front surface decreases with the terminal resistance Rt. Rn decreases relative to Rt, so that the electric current flowing to the chamber wall through Rn increases.

Figure 9:
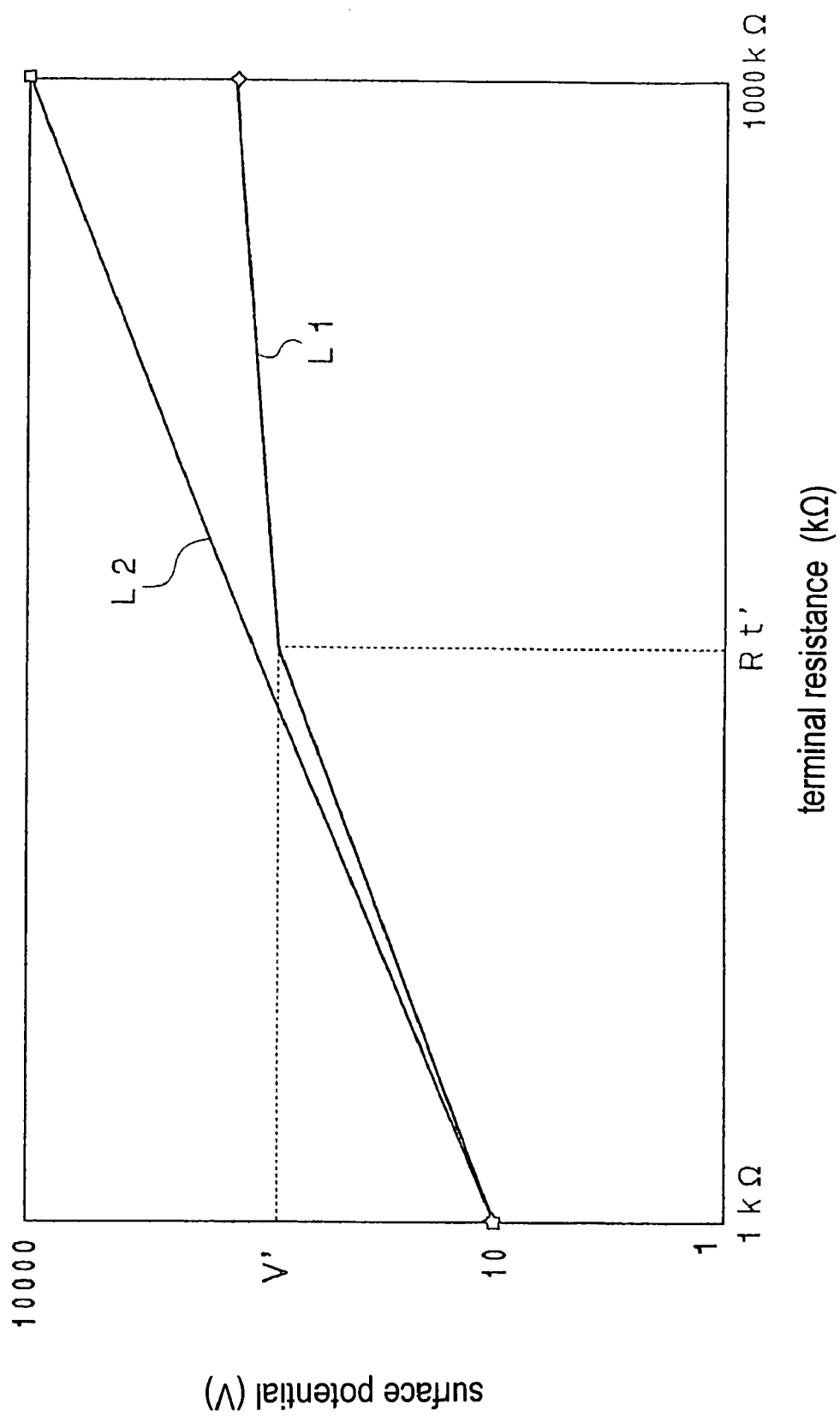
FIG. 9 is a graph showing a relationship between a terminal resistance and a surface potential of a base plate holder.

FIG. 9 is a graph showing a relationship between the terminal resistance Rt and the potential on the front surface of the base plate holder 13. The vertical axis represents the potential on the front surface, and the horizontal axis represents the terminal resistance. Both axes are expressed in a logarithmic scale. Line L1 represents measured value of the potential on the front surface of the base plate holder. Line L2 represents calculated potential according to a formula [(terminal resistance)×(ion beam current)]. The calculated potential represents the potential on the front surface of the base plate holder 13 when the entire ion current flows through the terminal resistance.

In FIG. 9, the ion current is 10 mA. When the terminal resistance is 1 kΩ, line L1 and line L2 both show the same potential on the front surface at 10 V. Therefore, the entire ion beam current is considered to return to an ion acceleration power source 10a through the base plate holder 13 and the terminal resistance Rt. When the terminal resistance Rt is larger than 1 kΩ, there is a difference between lines L1 and L2, and the difference increases with the terminal resistance Rt.

As described above, when the terminal resistance Rt is larger than 1 kΩ, there is a difference between lines L1 and L2. This means that a part of the ion beam current passes through a path other than the base plate holder 13 and the terminal resistance Rt, and returns to a cold end of the ion acceleration power source 10a. Specifically, a part of the ion beam current returns to the cold end of the ion acceleration power source 10a through Rn (refer to FIGS. 7, 8) between the plasma area and the chamber wall of the process chamber 2. Therefore, the current flowing through the base plate holder 13 decreases, and the potential difference between the front and back surfaces of the base plate 12 decreases.

An inclination of the slope of the line L1 decreases beyond a specific terminal resistance Rt=Rt', and a degree of inclement in the potential on the front surface greatly decreases when Rt is larger than Rt'. In other words, when the terminal resistance Rt exceeds Rt', the potential on the front surface of the base plate holder 13 is substantially saturated. Almost all of the ion beam current flows toward the chamber wall through Rn other than the base plate holder 13, and returns to the ion acceleration power source 10a. As described above, in the second embodiment, it is possible to control the quantity of the current passing through the base plate 12 with the terminal resistance Rt.

When the terminal resistance Rt is 1000 kΩ, due to the logarithmic axes, the current flowing through the base plate holder 13 is in the order of few percents in 10 mA. When the terminal resistance Rt is larger than Rt', the potential on the front surface of the base plate holder 13 is substantially a constant value of V'. This means that even when the plasma state is changed, the potential on the front surface of the base plate holder 13 is stably maintained at V'.

In the conventional ion beam device using the neutralizer, the neutralizer separated from the ion beam source generates the plasma for neutralizing the base plate charge. A bias voltage of the neutralizer is adjusted to maintain the potential on the front surface of the base plate 12 within a predetermined range. Accordingly, when the plasma state in the ion beam source is changed, it is necessary to adjust the neutralizer accordingly to maintain the potential on the front surface of the base plate within the predetermined range. When the plasma state is greatly changed, it is difficult to adjust, and the bias voltage of the neutralizer may be over-shoot and the potential on the front surface of the base plate deviates from the predetermined potential range.

In the second embodiment of the present invention, the plasma leaking to the process chamber 2 contacts the front surface of the base plate 12, and the ion beam current flows through the base plate holder 13 and the terminal resistance Rt to thereby determine the potential. As a result, the potential on the front surface of the base plate smoothly corresponds to the plasma state. When the plasma state is greatly changed, the potential responds to the change, thereby eliminating damage due to the over adjustment in the conventional neutralizer. Further, the potential recursively responds to the plasma state in a direction that the plasma is stabilized.

When the terminal resistance Rt is infinite, i.e. when the base plate holder 13 is insulated from the chamber wall, it is possible to prevent the damage due to the electric field stress. However, it is difficult to stabilize the plasma as in the case that the terminal resistance Rt is provided.

In the embodiments described above, the present invention is applied to the ion beam etching device. The present invention can also be applied to other devices using ion beams in the same way. With respect to the plasma source, in addition to the induction coupling type plasma source, it is possible to apply to a capacity coupling type plasma source or a plasma source in which a filament is provided for exciting plasma with thermal electrons.

In the explanation described above, the grid 8a corresponds to a first grid, the grid 8b corresponds to a second grid, the grid 8c corresponds to a third grid, the electron port 11 corresponds to an electro-conductive tubular member, and the base plate 12 corresponds to a beam irradiating target.

As described above, according to the present invention, the potential of the second grid does not influence the interior space of the electro-conductive tubular member. Therefore, the electrons in the plasma producing area can easily move to the outside of the plasma producing area. In the ion beam device equipped with the ion source according to the invention, it is possible to control the charge build-up phenomenon on the ion beam irradiating target.

While the invention has been explained with reference to the specific embodiments of the invention, the explanation is illustrative and the invention is limited only by the appended claims.

What is claimed is:

1. An ion source comprising:
   a plasma source device having a plasma excitation area for producing plasma;
   an ion extraction electrode having a first grid with a positive potential and a second grid with a negative potential, and disposed adjacent to the plasma excitation area for extracting ions from the plasma; and
   a communicating portion disposed in the ion deriving electrode for communicating the plasma excitation area with an outside thereof and for reducing an influence of the second grid on electrons so that the electrons easily pass therethrough from the plasma excitation area to the outside.

2. An ion source according to claim 1, wherein said communicating portion is formed of an electroconductive material and is attached to the ion extraction electrode such that the communicating portion has a potential same as that of the first grid.

3. An ion source according to claim 1, wherein said ion extraction electrode further includes a third grid with an earth potential, said communicating portion being formed of an electro-conductive material and being disposed in the ion extraction electrode such that the communicating portion has a potential same as that of the third grid.

4. An ion source according to claim 3, wherein said communicating portion includes a tube portion and a flange portion formed at one end of the tube portion.

5. An ion source according to claim 4, wherein said first grid is formed of a first plate with a first hole and said second grid is formed of a second plate with a second hole, said first and second plates being arranged such that the first plate faces the plasma source device and the second plate is situated at a side opposite to the plasma source device.

6. An ion source according to claim 5, wherein said first grid and second grid are arranged such that the first hole is aligned with the second hole, said tube portion of the communicating portion being located in the first hole and the second hole.

7. An ion source according to claim 4, wherein said third grid is situated at a side of the second grid opposite to the first grid and is formed of a third plate with a third hole, said third plate being arranged such that the third hole is aligned with the first and second holes so that the tube portion of the communicating portion is located in the first, second and third holes.

8. An ion beam device comprising the ion source according to claim 1 for irradiating beams of the ions from the ion source on a target material.

9. An ion beam device according to claim 8, further comprising a voltage source for providing the positive potential to the first grid, said power source having a cold end insulated from the beam irradiating target.

10. An ion beam device according to claim 9, further comprising a resistor connecting the beam irradiating target and the cold end of the voltage source.

* * * * *